US006858260B2

(12) United States Patent
Taylor et al.

(10) Patent No.: US 6,858,260 B2
(45) Date of Patent: Feb. 22, 2005

(54) CURABLE SEALANT COMPOSITION (75) Inventors: Donald W. Taylor, Liberty, MO (US); Todd W. Scrivens, Lawson, MO (US); Laurie Denise Lovshe, Canton, MI (US); Jeffrey T. Pachl, Holt, MO (US)

(73) Assignee: Denovus LLC, Moberly, MO (US)

( * ) Notice: Subject to any disclaimer, the term of this patent is extended or adjusted under 35 U.S.C. 154(b) by 515 days.

(21) Appl. No.: 10/091,726

(22) Filed: Mar. 6, 2002

(65) Prior Publication Data

US 2002/0182339 A1 Dec. 5, 2002

Related U.S. Application Data (63) Continuation of application No. 09/448,810, filed on Nov. 24, 1999, now Pat. No. 6,461,691, which is a continuation-in-part of application No. 09/197,107, filed on Nov. 20, 1998, now Pat. No. 6,277,898, which is a continuation-in-part of application No. 09/081,966, filed on May 20, 1998, now Pat. No. 6,174,932.
(60) Provisional application No. 60/047,290, filed on May 21, 1997, and provisional application No. 60/079,204, filed on Mar. 24, 1998.

(51) Int. Cl.$^7$ ............... C08F 2/46; C08F 2/50; C08L 63/00
(52) U.S. Cl. ............... 427/518; 427/508; 427/487; 427/516; 427/517; 427/140; 427/142; 427/207.1; 522/31; 522/74; 522/78; 522/79; 522/81; 522/83; 522/100; 522/102; 522/104; 522/113; 522/122; 522/134; 522/143; 522/170
(58) Field of Search ............... 427/508, 487, 427/516, 517, 518, 140, 142, 207.1; 522/100, 104, 83, 81, 79, 78, 74, 122, 113, 102, 134, 143, 64, 170, 31

(56) References Cited

U.S. PATENT DOCUMENTS

| | | | |
|---|---|---|---|
| 3,028,344 A | 4/1962 | Johnson | 260/2.5 |
| 3,618,442 A | 11/1971 | Kawakami et al. | 84/452 |
| 4,308,118 A | 12/1981 | Dudgeon | 427/54.1 |
| 4,560,579 A * | 12/1985 | Siadat et al. | 427/516 |
| 4,568,603 A | 2/1986 | Oldham | 428/195 |
| 4,593,051 A | 6/1986 | Koleske | 522/31 |
| 4,765,773 A | 8/1988 | Hopkins | 404/94 |
| 4,814,361 A | 3/1989 | Koleske et al. | 522/170 |
| 4,818,776 A | 4/1989 | Koleski | 522/31 |
| 4,844,947 A | 7/1989 | Kasner et al. | 427/53.1 |
| 4,846,905 A | 7/1989 | Tarbutton et al. | 525/65 |
| 4,874,798 A | 10/1989 | Koleske et al. | 522/31 |
| 4,892,894 A | 1/1990 | Koleske | 522/31 |
| 4,923,902 A | 5/1990 | Wycech | 521/54 |
| 5,006,364 A | 4/1991 | Fan | 427/44 |
| 5,013,924 A | 5/1991 | Armstrong et al. | 250/504 |
| 5,140,937 A | 8/1992 | Yamane et al. | 48/695 |
| 5,155,143 A | 10/1992 | Koleske | 522/31 |
| 5,158,989 A | 10/1992 | Ogitani et al. | 522/77 |
| 5,166,184 A | 11/1992 | Hashimoto et al. | 521/135 |
| 5,196,240 A | 3/1993 | Stockwell | 427/389.9 |
| 5,274,006 A | 12/1993 | Kagoshima et al. | 521/85 |
| 5,310,840 A | 5/1994 | Willett et al. | 526/273 |
| 5,348,604 A | 9/1994 | Neff | 156/272.8 |
| 5,389,149 A | 2/1995 | Carey et al. | 118/302 |
| 5,399,637 A | 3/1995 | Willett et al. | 526/142 |
| 5,437,919 A | 8/1995 | Welich et al. | 442/224 |
| 5,453,451 A | 9/1995 | Sokol | 522/42 |
| 5,516,813 A | 5/1996 | Starkey | 522/25 |
| 5,554,664 A | 9/1996 | Lamanna et al. | 522/25 |
| 5,672,637 A | 9/1997 | Mahoney et al. | 522/25 |
| 5,709,948 A * | 1/1998 | Perez et al. | 428/413 |
| 6,057,382 A * | 5/2000 | Karim et al. | 522/122 |
| 6,174,932 B1 | 1/2001 | Pachl et al. | |
| 6,277,898 B1 | 8/2001 | Pachl et al. | |
| 6,444,713 B1 | 9/2002 | Pachl et al. | |

FOREIGN PATENT DOCUMENTS

| | | |
|---|---|---|
| EP | 0 764 690 A3 | 6/1996 |
| EP | 0 764 690 A2 | 6/1996 |
| EP | 0 764 690 A2 | 3/1997 |
| EP | 0 764 690 A3 | 6/1997 |
| JP | 03166235 | 7/1991 |

OTHER PUBLICATIONS

U.S. Provisional application No. 60/047,290, Pachl, filed May 21, 1997.
U.S. Appl. No. 60/079,204, Pachl, filed Mar. 24, 1998.
U.S. Appl. No. 09/081,967, Pachl et al., filed May 20, 1998.
U.S. Appl. No. 09/197,124, Pachl et al., filed Nov. 20, 1998.
U.S. Appl. No. 09/344,198, Taylor et al., filed Jun. 24, 1999.
S/N 60/047,290, Mar. 21, 1997, Jeff Pachl Patent Application "Curable Sealent Composition".
S/N 60/079,204 Mar. 24, 1998 Jeff Paschl Patent Application "Radiation Curable Sealent Composition".
S/N 09/081,967 May 20, 1998 Pachl, et al. "Novel Foaming Composition and Methods for Making and Using the Composition."
S/N 09/344,198 Jun. 24, 1999 Taylor et al. "Novel Foaming Composition and Methods for Making and Using the Composition."

* cited by examiner

Primary Examiner—James J. Seidleck
Assistant Examiner—Sanza L. McClendon
(74) Attorney, Agent, or Firm—Michael K Boyer (57) ABSTRACT

A radiation curable, flexible, paintable composition produced from epoxy compounds and one or more polyol(s) has enhanced durability, thick and thin film adhesion, resistance to mold growth and dimensional changes while reducing solvent emissions. The composition can reduce, if not eliminate, runs and drips during the thermal bake cycles which are associated with using conventional compositions in automotive applications.

20 Claims, 1 Drawing Sheet

CURABLE SEALANT COMPOSITION

CROSS REFERENCE TO RELATED PATENT APPLICATIONS

This is a continuation of U.S. patent application Ser. No. 09/448,810, filed on Nov. 24, 1999, now U.S. Pat. No. 6,461,691, that is a continuation in part of U.S. patent application Ser. No. 09/197,107, filed on Nov. 20, 1998, now U.S. Pat. No. 6,277,898 B1, that is in turn a continuation in part of Ser. No. 09/081,966, filed May 20, 1998, now U.S. Pat. No. 6,174,932, and entitled "Curable Sealant Composition". The disclosure of these prior filed patent application is hereby incorporated by reference.

The subject matter herein also claims benefit under 35 U.S.C. 111(a), 35 U.S.C. 119(e) and 35 U.S.C. 120 of U.S. Provisional Patent Application Ser. No. 60/047,290, filed on May 21, 1997, entitled "A UV-Curable Sealant Compositions"; and U.S. Provisional Patent Application Ser. No. 60/079,204, filed on Mar. 24, 1998, entitled "Radiation Curable Sealant Compositions". The disclosure of the aforementioned Provisional Patent Applications is hereby incorporated by reference.

The subject matter of the instant invention is also related to copending and commonly assigned Non-Provisional U.S. patent application Ser. No. 09/344,198, filed on Jun. 24, 1999, Ser. No. 09/300,930, filed on Apr. 28, 1999, Ser. No. 09/081,967, filed on May 20, 1998 and Ser. No. 09/197,124, filed on Nov. 20, 1998 and entitled "Novel Foaming Composition and Methods for Making and Using the Compositions". The disclosure of these commonly assigned patent applications is hereby incorporated by reference.

FIELD OF THE INVENTION

The invention relates to a curable composition, methods for applying the composition as well as end-uses for the cured composition.

BACKGROUND OF THE INVENTION

Sealants are employed in a wide range of applications. For example, the automotive industry employs sealants between and upon metal seams and welds, within hollow cavities to impart structural and sound damping characteristics, among other locations.

One specific sealant environment involves the use of a sealant upon the welds in the so-called "roof-ditch" which is formed when joining the side panels of the body to the roof of the vehicle. The roof-ditch weld is conventionally covered with a bead or strip of polyvinyl chloride (PVC) based molding that is typically covered with a metal strip and painted. The PVC strip typically contains plasticizers, stabilizers. lubricants, among other compounds that can volatilize from the strip thereby causing cracking and shrinking. When the PVC strip cracks such can reduce the effectiveness of the strip and in turn allow the underlying metal to corrode.

Conventional sealants including those employed in roof ditches can also create conditions which are conducive to microbial, e.g., fungal, growth: especially in warm humid environments. The microbe growth occurs because the sealant contains substances that can be metabolized by the microbe. Consequently, there is a need in the sealant industry for a sealant with enhanced durability, and microbial resistance and cosmetic value that can be applied in an expedient manner. There is also a need in this industry for a sealant that can be repaired or replaced.

Methods for applying and curing/heating coatings are described in U.S. Pat. No. 4,844,947 (Kasner et al.), U.S. Pat. No. 5,348,604 (Neff) and U.S. Pat. No. 5,453,451 (Sokol). The disclosure of the previously identified patents is hereby incorporated by reference in their entirety for all purposes.

SUMMARY OF THE INVENTION

This invention is capable of solving problems associated with conventional practices by providing a radiation curable composition, which can be employed as a sealant that is easy to manipulate, durable, paintable, repairable/replaceable, crack and microbe resistant, e.g., mildew.

The inventive composition can be employed in a wide range of environments including in the automotive industry, e.g., as a roof-ditch sealant. The composition of the invention can be applied by using commercially available dispensing equipment, e.g., brushing, dipping, spraying or pumping, and cured in-situ, e.g., by a source of energy or radiation such as UV radiation, electron beam, laser, microwave, among other energy sources sufficient to cause curing sufficient to control sag or material flow for a specific application. If desired, the inventive composition can be painted.

In one aspect, the curable composition according to this invention comprises at least one epoxy compound, at least one carrier, e.g., polyol, and at least one suitable photoinitiators. In addition, the curable composition can optionally include at least one thickener or filler, as well as at least one monomers and/or at least one phenoxy resins. In one embodiment, the inventive composition can comprise: 1) at least one epoxy such as that supplied by UCB Radcure as Uvacure 1500, 1530, and 1534 or by Sartomer as SARCAT K126, 2) at least one and preferably two or more polyols such as the polyester polyols supplied by Union Carbide as Tone 0301 and by Huls America as Dynacoll 7110, 3) at least one photoinitiator such as sulfonium salt supplied by Union Carbide as Cyracure UVI 6974 and by Sartomer as CD 1010; and optionally, the following additional three components, 4) at least one thickener or filler such as silicon dioxide supplied by Cabot Corporation and 5) at least one monomer such as TONE M-100 also supplied by Union Carbide, a hydroxy polyester acrylate/hydroxyethyl acrylate blend or a monomer such as caprolactone acrylate supplied by Sartomer; and 6) at least one phenoxy resin such as phenoxy resin such as phenoxy resin PKHP 200 supplied by Phenoxy Specialties.

In another aspect, the curable composition is pre-initiated before contacting the substrate. By "pre-initiated", "pre-initiating" or "pre-initiate(s)" it is meant exposure to a suitable source of energy or radiation at least once: 1) while combining the components of the composition, 2) when preparing at least one component of the composition prior to combining with other components, 3) during transport of the composition or components thereof through a conduit or related handling equipment, among other suitable techniques to pre-initiate curing of the composition. If desired, the composition can be pre-initiated by a radiation source that is embedded or located within or upon a conduit or other member such that radiation can be supplied to the composition or components thereof, e.g, UV radiation is shown through a window on a conduit that delivers the composition to a substrate. The radiation source may also be embedded within the system for dispensing the composition, e.g., a UV source located within a nozzle that applies the composition onto a substrate. Pre-initiating the curable composition permits controlling the viscosity of the composition as well as reducing the curing time after being applied onto a substrate.

These and other aspects of the invention will become apparent from the specification and claims which follows.

DETAILED DESCRIPTION

A first aspect of the invention relates to a radiation curable composition comprising at least one epoxy, epoxy based compounds and epoxy functional or modified compounds, at least one carrier, e.g., polyols, and at least one photoinitiator.

The first of the components employed in the curable composition comprises an epoxy compound. While any suitable epoxy and epoxy functional compounds (or mixtures thereof) can be employed in the inventive composition, a curable liquid cationic epoxy compound and, in particular, a cycloaliphatic epoxy compound is preferred. Specific examples of suitable epoxy compounds comprise those materials supplied by UCB Radcure as Uvacure 1500, 1530, and 1534 or by Sartomer as SARCAT K126. Normally, the epoxy corresponds to about 40 to about 90 wt. % and preferably about 45 to about 60 wt. % of the composition prior to curing.

Without wishing to be bound by any theory or explanation, it is believed that the inventive composition employs a cationic reaction that can be photoinitiated, that continues as a cascade reaction; especially if heated. It is also believed that when the inventive composition is exposed to a source of suitable radiation, e .g., UV energy, a relatively thin "skin" forms substantially instantaneously upon the surface of the composition. This surface skin serves to stabilize the shape of the composition until the remainder of the composition has reacted, e.g., cross-linked, into a self-supporting structure. The thickness of the skin as well as the resultant article can be tailored to satisfy a particular end-use, e.g, an article having a thickness of from about 0.05 to at least about 10 mm as well as forming a skin upon an underlying uncured material.

While not necessary to obtain a useful composition, the effectiveness of the aforementioned epoxy compound is enhanced by the second component of the composition, at least one polyol. While it is believed that any polyol recognized in the art can be suitably employed in the invention, examples of preferred polyols comprise polyether polyols and polyester polyols such as those supplied commercially by manufacturers such as Union Carbide, Huls America and Arco. Specific examples include polyester polyols supplied by Union Carbide as Tone 0301 and by Huls America as Dynacoll 7110. The amount of polyol in the composition prior to curing preferably ranges from about 5 to about 50 wt. %, more preferably 10–25 wt. %.

Moreover, the epoxy to polyol ratio can range from about 1:1 to about 2:1. The use of more than one polyol is desired. By employing more than one polyol, the properties of the inventive composition can be more effectively controlled. Examples of properties that can be tailored include glass transition point, viscosity. adhesion to the underlying substrate (e.g., in the case of a roof ditch the automotive E-coat), degree of cross-linking in the cured composition, flexibility, among other desirable properties.

A photoinitiator is employed in the composition when using UV radiation for inducing an interaction among one or more components of the curable composition, typically the epoxy and polyol. The amount of photoinitiator normally corresponds to about 0.5 to about 2 wt. % of the composition prior to curing. While any suitable photoinitiator or mixtures thereof can be employed, UV photoinitiators are preferred. In particular, desirable results have been obtained by using a onium salts such as sulfonium salt, triarylsulfonium hexafluoroantimonate, diaryliodonium hexafluoroantimonate, and mixtures thereof, among others. Specific examples of suitable sulfonium salts include those supplied by Union Carbide as Cyracure UVI 6974 and by Sartomer as CD1010.

In another aspect of the invention, the photo initiator can be partially or completely replaced by an acid source such a Lewis acid. Examples of suitable Lewis acids include sulfonic acids, phosphoric acid, citric acid, carboxylic acid, tannic and oxalic acids, and mixtures thereof, among others. Normally, better results are obtained by using a source of phosphoric acid. In this aspect of the invention, the composition is employed in a two component system with the epoxy compound and the acid source being separately maintained until it is desirable to produce a self-supporting coating or an article. When the epoxy and acid are contacted a reaction occurs providing a product similar to the one described herein when a photoinitiator is used. The amount of acid normally corresponds to about 0.25% to about 3.0% wt. % of the composition prior to curing. The epoxy and/or acid can be admixed with other components of the inventive composition, e.g., the acid can be admixed with a polyol.

The ingredients of the two component system can be combined by using any art recognized mixing technique while ensuring that two components are segregated prior to usage. The components can be contacted either by hand in a suitable container, or dispensed through a commercially available static mixing tube and simultaneously applying the resulting fluid onto the substrate in question.

The curable compositions according to the invention can include other optional components depending on, among other factors, the ultimate end use of the cured material. To this end, at least one thickener or filler can be included as an optional component of the inventive composition. The amount of thickener normally corresponds to about 0.5 to about 5.0 wt. % of the composition prior to curing. While any suitable thickener can be employed fumed or aerosol silica can be used to obtain desirable results, e.g., fumed silicas commercially supplied by Cabot Corporation (M-5 Grade) and Degussa. Normally, precipitated silica is not employed.

The thickener is typically non-reactive and employed to create a thixotropic fluid, e.g., having a viscosity of about 20,000 to about 80,000 centipoise. Consequently, the thickener can be introduced into the composition in any expedient manner, e.g., added to the polyol and vacuum mixed. If desired, the thickener can comprise a treated silica such as a silica having a silane surface treatment, e.g., TS720 supplied by Cabot Corporation.

The viscosity of the composition or components thereof can also be modified by exposure to a radiation source, e.g., by pre-initiating the composition. Exposure to a radiation source causes at least a portion of the composition or components thereof to cure thereby causing an increased viscosity.

In addition, the curable composition can include a monomer component to facilitate formation of the cured material.

Examples of suitable monomeric materials comprise acrylates, caprolatones, polycarbonates, and mixtures thereof, among others. The amount of monomer typically comprises about 1 to about 5% by wt. of the composition prior to curing. Without wishing to be bound by any theory or explanation, it is believed that the monomer component functions as a cross-linking agent during curing.

Yet other additives can also be included in the curable composition. Depending upon the inventive composition and particular end-use of a substrate which is coated with the inventive composition, suitable additives can comprise: bis-F epoxy, thickeners. fillers such as carbon black, polyproplyene, proplyene carbonate. calcium carbonate. microspheres (such as Micropearl, supplied by Pierce & Stevens. Corp.); surfactants, pH indicators, biocides/ antifungal compounds, solvents, fire extinguishants, silanes. pigments, UV stabilizers, PVC, PTFE, resins such as ethylene-vinyl acetate co-polymers, among other compounds which do not adversely impact curing.

The additives should be selected so as to not effect transmission of the curing radiation. For example, when employing a UV curable system, best results are obtained by avoiding materials that affect UV light transmission. Because of this, the two component system and systems activated by an electron beam or other energy sources can include a wider range of materials such as dyes, pigments, UV light stabilizers, among others. While any suitable pigment can be employed, specific examples of pigments comprise at least one member selected from the group consisting of E2557 Green, E6824 Yellow, E4102 Red, 626 blue (all supplied by Akrochem) mixtures thereof, among others. Examples of suitable UV 1 stabilizers comprise at least one member of Oxalanilide class, mixtures thereof, among others. The amount of such additives. if present, normally comprises about 0.1 to about 2.0 wt. % of the composition, prior to curing.

If desired, the inventive composition can include fibers, platelets, particles, among other components in order to form a composite article. Typically, the amount of such additives will range from about 1 to about 15 wt percent of composition prior to curing. Normally, it is desirable to minimize the presence of basic materials and/or those that affect UV transmittance when a UV curable system is employed.

The uncured composition can be provided by any suitable means for admixing or combining the components of the composition. Normally, at least one of the epoxy or polyol will be heated to a temperature that is effective for increasing the rate at which the thickener, e.g., silica, can be dispersed. Bubbles formed during the mixing process can be removed by pulling a vacuum on the mixture. Greater details regarding the mixing process can be found in the forthcoming Examples.

A specific example of a curable composition according to this invention comprises the following:

TABLE 1

| Chemical Name | Trade Name | Supplier | Wt. % |
| --- | --- | --- | --- |
| Cycloaliphatic Epoxy | Uvacure 1500 | UCB Radcure | 25–45 |
| Polyester Polyol | Tone 0301 | Union Carbide | 0–45 |
| Polyester Polyol | Dynacoll 7110 | Huls America | 10–35 |
| Hydroxy Polyester Acrylate/Hydroxyethyl Acrylate | Tone M-100 | Union Carbide | 10–35 |

TABLE 1-continued

| Chemical Name | Trade Name | Supplier | Wt. % |
| --- | --- | --- | --- |
| Silicon Dioxide | Cab-O-Sil | Cabot | 0–8.0 |
| Sulfonium Salt* | Cyracure UVI 6974 | Union Carbide | 0.5–3.0 |

*50 wt. % propylene carbonate

The inventive composition can be applied and cured effectively at ambient temperatures. e.g., about 65 about 95° F., thereby obviating the need to heat the composition during application. In some cases, however, it may be desirable to monitor and control the curing temperature if ambient temperatures are extreme. By obviating the requirement for heat curing, the instant invention permits utilization of unheated dispensing equipment as well as application upon unheated substrates.

The particular substrate is not critical to the invention and clearly depends on the end use for the cured materials. Examples of suitable substrates can comprise one or more of steel, stainless steel, galvanized surfaces, surfaces having a coating such as E-coat, paint, among a virtually unlimited array of substrates. While heating is not necessary to apply the composition, once applied the cured composition can be baked or heated for improving the adhesion of the composition to the underlying substrate. For example, a source of infrared energy can be employed in combination with a source of UV or electron beam radiation, e.g., a UV lamp.

Curing of the inventive composition can be initiated via a source of radiation suitable for activating the photoinitiator. Since the use of UV curable initiators is preferred, the preferred radiation source provides ultraviolet radiation (UV). To this end, while curing can be initiated by naturally occurring UV light, normally, a man-made source of UV radiation is employed, e.g., to cross-link the polymeric matrix. The source of UV radiation can range widely such as a lamp mounted above a conveyor, a lamp mounted on a robot arm, a series of lamps mounted in a gantry located above or adjacent to a robot that dispenses the composition, among other apparatus for supplying UV radiation.

After applying the inventive composition upon a suitable substrate, the composition can be exposed to a high output source of energy, e.g., UV radiation (approx 2.5 J/cm$^2$ @ 365 nm, which may vary with exposure time, distance from source and type of bulb), that initiates curing thereby locking or freezing the composition as a coating upon the substrate. The specific wavelength of UV can be tailored to satisfy a wide range of product uses, exposure times and distance from the composition to be cured; but, normally ranges from greater than about 250 to about 400 nm and having an output of about 2.5 to about 4.0 J/cm2. In some cases, it is desirable to employ one or more UV sources that emit differing UV wavelengths either simultaneously or sequentially. e.g., lamps that emit differing wavelengths and/or by one type of lamp having a filter. Examples of suitable UV curing systems and lamps are Model F600 System, "D", "V" and "H" lamps all of which are supplied by Fusion Systems Corporation, Rockville, Md.

The radiation exposure time of the inventive composition is typically about 1 to about 10 seconds. The specific exposure time can be tailored depending upon the distance from the radiation source, intensity of the source, relative speed between the composition to be cured and the radiation source, among other parameters. As described above, the source of, e.g., UV radiation, can be supplied by any suitable means such as a conveyor, UV lamp such as a Fusion Systems "H" bulb attached to or associated with an arm of a robot which dispenses uncured composition, e.g., as a bead within a roof ditch or a spray upon a substrate. Consequently, the inventive composition can be readily employed in conventional fabrication or manufacturing processes. Typically, a safety curtain or booth, which surrounds the radiation source, is desirable for minimizing any impact upon personnel. When the composition is employed in automotive applications such as a roof ditch, the radiation (UV) curing step can be followed by a thermal bake, which enhances formation of a permanent adhesive bond to the underlying surface, e.g., an electrocoat (E-Coat), and improves the final curing of the sealant's polymer matrix. The thermal bake is typically conducted at a temperature greater than about 340° F. and less than that which adversely impacts the coated substrate. While a thermal bake is not required for all applications of the inventive compositions, such a thermal bake can enhance the adhesion between the inventive composition and the underlying surface, and if desired can be employed in conjunction with radiation (UV) exposure.

The inventive composition also has the ability to cure with ultraviolet rays from the sun. While the sun can be employed as a source of UV radiation, the cure time is relatively long in comparison to curing with concentrated/high energy UV sources. Examples of applications that can employ natural UV curing include the building/construction industry such as roof panel joints for metal building, skylight seals, concrete/cement sealants, drywall joint-compound ("mud"), among other applications exposed to natural UV radiation. For example, the inventive composition can be applied or sprayed upon concrete/cement and cured in natural UV to form a water-proof paintable coating, e.g., an interior or exterior basement sealant and a swimming pool liner or seal.

Subsequent operations to the coated substrate will typically not disturb the coating, e.g., when the coating is employed as an automotive roof ditch sealant the coating will not drip or run during subsequent manufacturing steps such as painting. The long term dimensional stability of the cured inventive composition is improved in comparison to conventional PVC sealant compositions, e.g., no cracks or shrinkage become evident during UV exposure and repeated thermal bakes or environmental exposures. When shrinkage was measured substantially in accordance with ASTM D2453, the inventive composition had a shrinkage of about 0% when measured visually.

The inventive composition is a high cosmetic paintable material (a so-called Class A automotive). With proper application, the sealant provides excellent smoothness and gloss retention, e.g., the inventive sealant does not adversely impact the distinctiveness of image (DOI) of an overlying paint. When deposited within a channel or groove the cured composition typically forms a reverse miniscus, or "U-shaped" cross section. Such a configuration reduces paint cracking; especially when the inventive composition is employed for sealing automotive roof ditches.

The inventive composition possesses an improved adhesion to conventional paint systems such as standard solvent based pigmented and clear systems, water based, latex, powder paints, automotive E-coats, mixtures thereof, among others. The inventive composition also possesses a desirable resistance to the ambient environment, e.g. twelve month Florida exposure testing in accordance with conventional testing methods has proven the inventive composition's durability as well as its resistance to mold/mildew growth, cracking and chalking. The inventive composition is also resistant to paint staining, fading and cracking as a result of Xenon Arc exposure.

The chemistry of the inventive composition allows the composition to be tailored to possess a wide variety of physical characteristics. By utilizing the constituent ratios of the composition, the physical characteristics of the cured product will range from a flexible and relatively soft article to a hard sandable product. These characteristics can be obtained by varying the epoxy to polyol weight ratio e.g., the ratio can range from about 2:1 to about 4:1. Normally, an increased amount of epoxy will correspond to a harder cured coating. When the composition contains relatively large quantities of polyol, the hardness of the cured coating is reduced upon exposure to moisture, e.g, the Shore "A" Hardness when determined in accordance with conventional measuring techniques ranges from about 70 to at least about 95. The presence of relatively large quantities of polyol can, however, improve adhesion of the inventive composition to the underlying substrate.

The hardness of the composition can be increased by including a hardening resin such as a phenoxy resin. While any suitable hardening resin can be employed, examples of suitable resins comprise at least one member selected from the group consisting of phenoxy resin, solid epoxy (in particulate form), mixtures thereof, among others. Normally, the amount of hardening resin corresponds to about 1 to about 9 wt. % of the composition prior to curing. By including such a hardening resin, the Shore "D" hardness of the composition, subsequent to curing, can range from about 60 to about 80. The hardening resin also improves the solvent and moisture resistance of the cured composition.

In addition, the viscosity of an uncured composition can be tailored by adjusting the silica to polymer ratio and/or the polyol ratio. The viscosity of the uncured composition can also be increased by introducing a solid epoxy in addition to or as a replacement for the aforementioned epoxies. Examples of suitable solid epoxies comprise bis-phenol A, novalac resin, mixtures thereof, among others. The viscosity can be tailored to be similar to paint, or increased to a grease or paste-like consistency. The presence of a solid epoxy can also be employed for imparting enhanced resistance to moisture.

The inventive composition, prior to curing, is typically greater that 95 wt. %, preferably, about 98.5 to at least about 99.75 wt. % solids, e.g., about 99.5 wt. % solids. While the dimensional thickness of the inventive composition can be tailored to satisfy a wide range of end-uses, normally the composition is applied at a thickness of about 0.05 mm to about 10 mm thick, e.g., in the case of roof ditch the composition is about 5 mm thick. The ability of the inventive composition to form such relatively thick layers is in contrast to conventional practices and a marked improvement.

While the inventive composition is not adversely affected by most solvents, the composition can substantially reduce, if not eliminate, the presence of solvents, e.g., the inventive composition can be essentially volatile organic compound (VOC) free. The inventive can also be substantially free of polyvinyl chlorides and its monomers. That is, the uncured composition may include about 0.1 to about 5.0 wt. %. normally about 0.5 wt. %, of solvents and/or PVCs, e.g., a solvent which functions as a carrier for the photoinitiator, e.g., about 0.50 wt. % propylene carbonate.

As described above, the inventive radiation cured composition can be employed in a wide range of applications; especially in the automotive field. One such example comprises a roof ditch sealant which is a Class A paintable sealer.

Once the inventive composition is applied, the composition is cured in situ by a source of concentrated UV light thereby permitting an "in-line" curing application. That is, a robotic arm can be a double functional tool, with both a dispensing nozzle for delivering the inventive composition into a roof ditch and the curing lamp attached in parallel. Alternatively, the curing lamp(s), e.g, one or more UV and infrared lamps, can be physically separate but operationally connected to the robot, e.g., the lamps are mounted above or beside the robot on a gantry wherein the movement/operation of the robot and lamps are controlled by computer. The inventive composition can be supplied to the robot arm by using any suitable pump such as a positive displacement reciprocating piston pump, e.g., Model No. 711008-662-000 5 gal. pump supplied by Graco Inc.

In one particular aspect of the aforementioned roof ditch application, a plurality of protrusions, studs or mechanical fastening means having any desirable shape can be located within and attached to the bottom of the ditch for enhancing the bond between the ditch and overlying radiation cured composition. When studs are employed, the studs can be welded within the ditch when forming the underlying weld that forms the ditch. e.g, when welding the automotive roof and side body panels together. Any protrusions can also be affixed within the ditch by a suitable adhesive, or by mechanical attachment. The height and specific configuration of the protrusions depends upon the application: but, normally, the protrusions are about 3 to about 7 mm tall. These protrusions can be fabricated from any suitable material such as thermoplastics such as nylon, metal. among other materials. When introduced into the ditch, the inventive flowing composition embeds the protrusions, fills the ditch and can form a self-leveling surface. These protrusions can also be utilized in after-market applications when repairing or replacing a roof ditch sealant.

The configuration of the roof ditch can be tailored for improving the mechanical bond between the ditch and radiation cured composition. For example, a ditch having trapezoidal cross-section can be employed. If desired, the previously described protrusions or studs can be employed within a tailored ditch configuration.

The inventive composition can also be applied upon non-planar surfaces. For example, the inventive composition can be employed as a Class A paintable automotive coach and coach joint sealant. Such joints can be on a horizontal or vertical surface. The ability of the inventive composition to be cured substantially simultaneously following application permits the composition to be employed on such vertical surfaces. In order to enhance vertical surface application, the viscosity of the inventive composition can be increased by adding about 3 to about 10 wt. % of a thickener such as CAB-O-SIL silica, elastomer modified or adducted epoxy, polyether polyol, mixtures thereof, among others.

Moreover, the inventive composition can be employed for repairing dents and scratches in a painted surface, e.g., an automotive door. That is, the composition can be applied upon a surface, exposed to a radiation source such as UV light, and, thereafter, sanded as needed and painted in accordance with conventional methods. Similarly, a two component system can be employed without using exposure to a radiation source. For example, a two component system based upon an interaction between an epoxy and acid can be combined, applied upon a surface as a gel, permitted to harden and adhere to the surface and, thereafter, prepared for painting by using conventional techniques. In some cases, the substrate being repaired and/or inventive composition can be heated to enhance adhesion to the substrate.

The inventive composition can be applied onto a wide range of substrates. The inventive composition can be employed in a method for applying one or more coatings upon an automotive surface. For example, an automotive assembly may be immersed within the inventive composition and, thereafter, cured by being exposed to radiation. Such an immersion may be employed, for example, as an enhancement or a replacement for conventional automotive E-coats. Once cured, the automotive assembly can be painted in accordance with conventional methods. Without wishing to be bound by any theory or explanation, it is believed that the composition may be tailored for application upon unpainted surfaces as a corrosion protectant, e.g., sprayed upon an automotive underbody, among other applications.

In one aspect of the invention, the inventive composition can be employed as an automotive brake rotor coating for imparting corrosion protection. The inventive composition can be applied via an aerosol or a spray upon the rotor to form a thin film coating. The resultant layer is sacrificial in that the layer is consumed or removed when contacted by the brake pad. In a related aspect, the inventive composition can be employed as a temporary corrosion protectant such as upon saw blades wherein friction or other usage of the protected article removes the coating. In such cases, it can be useful to add one or more surfactants, e.g., less than about 1.0 wt. % of Fluorad FC-171 fluorochemical available from 3M.

In another aspect of the invention, the inventive coating is employed as a Class B paintable coating. For example, the inventive coating is applied as a spray upon a painted or unpainted metal substrate such a lower automotive body panel in order to form an anti-chip coating (so-called stoneguard). The inventive composition can also be sprayed upon the floor pan, roof, among other regions of an automobile during assembly for improving acoustics, among other properties.

In another aspect of the invention, the inventive composition can be mixed. molded, extruded or shaped into an article that is subsequently exposed to a radiation source. If desired, the inventive composition can be co-extruded with another material thereby forming an article having a radiation curable surface. While a wide range of articles can be formed, one example of such an article comprises automotive moldings. Such moldings can be fabricated and shipped to an automotive assembly plant, or extruded and cured directly on the automobile.

Moreover, the inventive composition can be shaped into hollow spheres or other continuous surfaces by being shaped while being exposed to a source of radiation. The inventive composition can be sprayed/spray dried in a conventional manner while being exposed to radiation. The resultant spheres or product can be employed alone or incorporated into another matrix to obtain a composite. Similarly, the inventive composition can be cast into a film or web.

In a further aspect of the invention, the inventive composition is employed as a repair material for automotive coatings, seals, household applications, among other areas wherein it is desirable to have long-lasting, flexible and paintable sealants. For example, the inventive composition can be applied upon a substrate, cured with radiation and exposed to infrared (IR) radiation for 90 seconds thereby forming a seal to repair a crack in the underlying substrate or coating.

In a still further aspect of the invention, the inventive composition can be employed as a top-coating upon a wide range of articles including fasteners, end-fittings, couplings, among others. These articles can be immersed within the inventive composition, centrifuged (so-called dip-spin processing), and exposed to a radiation source thereby curing the composition and forming a durable outer or top-coating upon the articles.

The previously described curable compositions can be modified to obtain a gel consistency by adding a gelling agent. Examples of suitable gelling agents include treated or untreated silica, detergents, elastomer modified or adducted epoxy, polyether polyols, mixtures thereof, among others. When using a UV curable composition, the gelling agent should not adversely affect UV transmission through the composition. The gelling agent normally comprises about 0.5 to about 10 wt. % of an uncured compositions. By employing a gelling agent, the viscosity and handling characteristics of the inventive composition can be improved, e.g., the composition can be tailored to possess a putty or caulk-like consistency.

Moreover, the curable compositions can be modified to obtain an acid or radiation activated foam. Any suitable chemical or mechanical expansion agent can be added to these compositions. Examples of suitable chemical or mechanical expansion agent include water, hydrazide, diphenyloxide-4,4-disulphohydrazide, hexamethylene diamine carbamate, carbonamide, azocarbonamide, sodium bicarbonate, carbon dioxide, fluorocarbons, encapsulated materials, e.g, Expancel® supplied by H.M. Royal; mixtures thereof, among others. The expansion agent normally comprises about 0.5 to about 10 wt. % of an uncured compositions. The expansion agent becomes activated by being exposed to either UV or a suitable source of heat, e.g, an exothermic reaction between an epoxy and acid source. For example, when employing a UV curable composition and such a composition is exposed to UV light an exothermic reaction occurs that in turn causes the expansion agent to swell thereby increasing the volume of the composition. Similarly, when an acid activated composition is employed, the heat released when the acid contacts the epoxy causes the expansion agent to swell. Radiation activated foams are described in greater detail in copending and commonly assigned U.S. patent application Ser. No. 09/344,198, filed on Jun. 24, 1999 and entitled "Novel Foaming Composition and Methods for Making and Using the Composition"; the disclosure of which is hereby incorporated by reference.

While the above description places particular emphasis upon applying the inventive composition within an automotive roof ditch, the inventive composition can be applied to a wide range of substrates. Examples of suitable substrates include at least one member of the group consisting of metals such as stainless steel, galvanized steel. concrete, cement, glass, wood, among others. In the case of metal substrates, the inventive composition can be applied upon a welded joint including a joint formed by spot, wire and laser welding.

The composition of the instant invention can be applied to a substrate by any suitable method. Such methods include brushing, immersing, pumping, dipping, painting, spraying, among other suitable conventional methods. When the inventive composition is applied upon the weld in an automotive roof ditch, it is desirable to pump the composition into and along the ditch. Because of its low viscosity at, for example, at 77° F., the composition and its thixotropic behavior, equipment such as a reciprocating piston (positive displacement) pump, gear pump, pneumatic tube (such as that supplied by SEMCO), caulking tube (hand trigger), air or airless spray, squeeze tube, brush, among other commercially available equipment, may be used. The uncured composition may then be manipulated further, e.g., pressed or embossed, into a desired finish.

The inventive composition, once applied, is normally cured with a suitable, e.g., UV, radiation source. This can be done immediately upon application to a substrate, or delayed depending upon the characteristics desired in the coated substrate. For example, by delaying the cure, the composition can be shaped, or leveled/smoothed to better conform to the underlying substrate. As aforementioned, the cure may be followed by a bake, or allowed to finish curing naturally. The sealed joint or coated substrate may now be painted or otherwise finished. If desired, one or more layers of compositions which are chemically similar or distinct can be applied upon a cured composition, e.g. two or more layers of UV cured composition can be applied sequentially or used to form a laminate structure.

Figure 1:
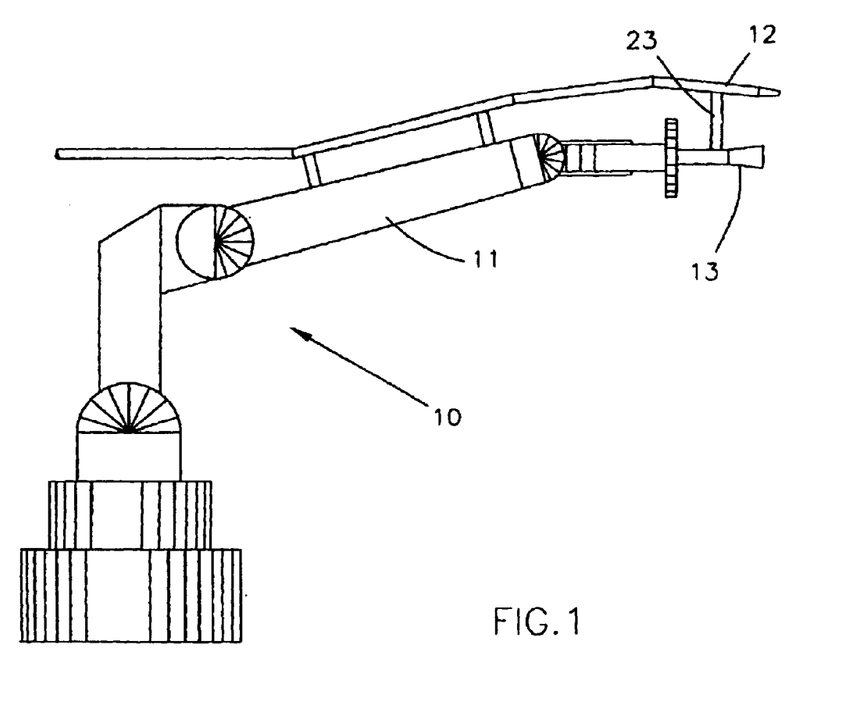
FIG. 1 is a schematic drawing of an apparatus that can be used for applying the inventive composition by using robotic means.

One method for applying the inventive composition is illustrated by the Drawings. Referring now to FIG. 1, FIG. 1 is a schematic diagram of a robotic means for applying the inventive composition; especially in automotive applications such as a roof-ditch sealant. Robot 10 includes arm 11 that supports conduit 12. Examples of robots include those supplied by Fanuc, Inc., Rochester Hills, Mich., and ABB as ASEA Model 2000. A means for providing UV radiation 13 can be supported by robot arm 11. The operation and movement of robot 10 and arm 11 are controlled and monitored by commercial computer means (not shown). The inventive composition is supplied under pressure via conduit 12 to any desired location and in a virtually unlimited array of configurations. The light intensity from means 13 and fluid flow rate through conduit 12 are also controlled and monitored by commercially available computer means (not shown).

Figure 2:
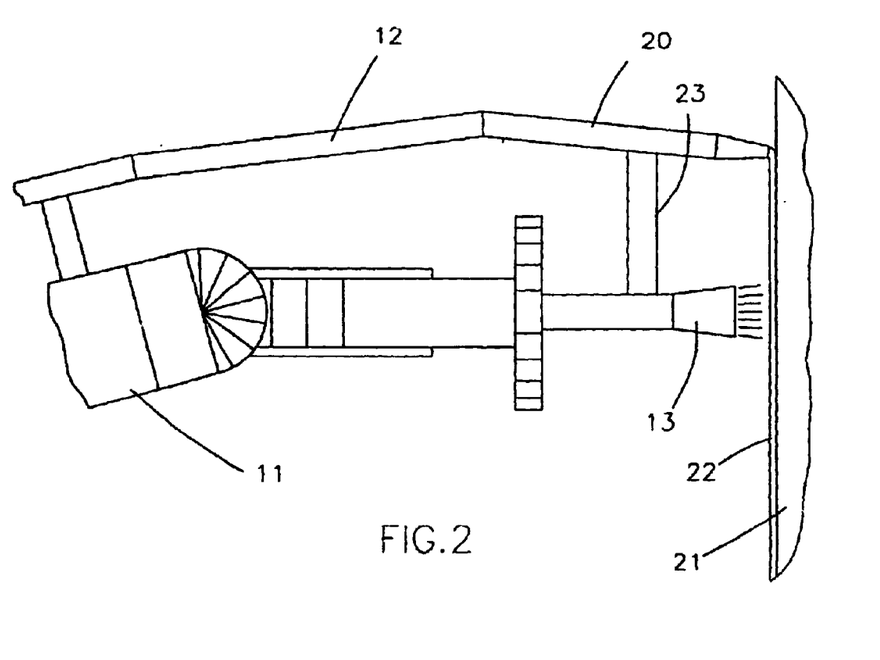
FIG. 2 is a schematic drawing of the apparatus illustrated in FIG. 1 as the inventive composition is applied.

More details regarding one method for applying the inventive composition are shown by FIG. 2. Referring now to FIG. 2, conduit 12 is in fluid connection with dispensing or nozzle means 20. The inventive composition is dispensed from nozzle means 20 and applied upon a surface 21 thereby forming coating or seal 22. The thickness and configuration of seal 22 are determined by the pressure within conduit 12 and movement of arm 11. Substantially immediately after being dispensed, the composition is exposed to UV radiation from lamp means 13. The lamp means 13 and dispensing nozzle 20 are in fixed spatial relationship by connecting means 23 that is in turn affixed to arm 11. The UV exposed seal 22 is at least partially cross-linked or cured thereby forming a self-supporting seal 22. While the entire thickness of seal 22 may not be cured, the cured portion of seal 22 is adequate to prevent the seal 22 from fluid flow. Uncured portions, if any, of seal 22 can become cured during subsequent heat treatments, e.g., if the seal 22 comprises a roof ditch then residual curing will occur when exposed to high temperature painting processes.

While the above description emphasizes curing an epoxy containing compound by exposure to a suitable radiation source, the inventive method can be achieved by employing other polymer systems such as silicones, urethanes, silanes, hydroxyl or caboxyl modified elastomers; hydroxyl, carboxyl or epoxy functional compounds, reactive liquid polymers such as Hycar®, among others. That is, a polymer system which when exposed to a suitable source of radiation including pre-iniating causes at least a portion of the system to cure.

The following Examples are provided to illustrate not limit the scope of the invention as defined by the appended claims. Unless indicated otherwise, the materials and equipment discussed below are commercially available.

EXAMPLES

The exemplary compositions were obtained by blending its constituents. The following equipment was employed for blending the constituents:

1) Heated mixing Vessel of suitable volume (50–300 gal)
2) Mixer (Rotor-Stator, or Dispersion Blade, or Double Planetary Paddle)
3) Vacuum
4) Heated Liquid Pump
5) Unheated Liquid Pump
6) Weight Scale
7) Shipping Container Filling Equipment (Tube, Pail, or Drum)

Example 1

Blending began by pumping into the mixing vessel polyester polyol (Dynacoll 7110) at 250 F. One-hundred fifty-four pounds of a second polyester polyol (Tone 0301) was added to the mixing vessel. The polyols were blended until both polyol constituents are fully dissolved in each other. The polyol mixture is substantially transparent. The temperature within the mixing vessel was maintained at 180 F.

One-hundred thirty-five pounds of cyclaliphatic epoxy (Uvacure 1500) was then added to the mixing vessel. When all of the epoxy was uniformly mixed, 3.3 pounds of sulfonium salt (UVI-6974) were added to the vessel. Mixing was continued at a temperature of 180 F for 10 min.

Eleven pounds of silica (Cab-O-Sil) was then added to the mixing vessel. The silica was stirred into the mixture until wetted. Then another 11 pounds of silica (Cab-O-Sil) is added. Mixing was continued to fully dispersed the constituents of the vessel. Mixing was then performed at high shear rate under vacuum until substantially no lumps and no air bubbles were visible. It was important to eliminate all air bubbles, for they may cause a discontinuity in the delivery line during customer application, and therefore an undesirable inconsistent delivery.

When vacuuming was completed, the resultant mixture was warm and clear with a consistency of syrup. When the batch is cooled and the shear stresses diminished. the mixture was thickened to a near gel state while maintaining clarity. For best results, shipping or storage containers should filled prior to cooling.

After the containers are filled and material cooled, specific gravity and viscosity checks should be performed to insure batch quality. For best results and in order to avoid premature curing of the composition, all storage and shipping containers should be opaque or shielded from UV sources including sunlight and fluorescent lighting. Such exposure could result in cure initiation thereby preventing the contents from being pumped.

Example 2

One inventive composition was produced in accordance with the following method. A two (2) gallon Ross Model PD2 planetary dispersion mixer was obtained and in connected to a Chromolox heater. The dispersion mixer was operated at a temperature of 190 F.

2824 grams of liquid polyol (Tone 0301) and 888 grams of the solid polyol (7110) were introduced into the mixer and mixed for 10 minutes. Sixty (60) percent (240 grams) of the silica thickener (Cabosil supplied by Cabot Corporation) was introduced into the mixer and the combination was mixed for another 10 minutes.

500 grams of epoxy (Uvacure 1500) and the remaining 40% (160 grams) of the silica were then added and mixed for 10 min. This was followed by adding 60 grams of the photoiniatitor (Cyracure 6974) and 2172 grams of epoxy (UVACure 1500) to the mixer and mixed for 5 minutes. The contents of the mixer were then mixed under vacuum for 10 minutes thereby producing 1.3 gallons of the inventive composition.

Example 3

222 g of polyester polyol (Dynacoll 7110) at a temperature of 250 F were poured into the a gallon can. About 706 g of a second polyester polyol (Tone 0301) were added to the first polyol. The polyols were blended in a Rotor-Stator Mixer. This until both constituents are fully dissolved in each other. The mixture was transparent at this point. The temperature of this mixture was maintained at 180 F.

Approximately 618 g epoxy (Uvacure 1500) were admixed with the heated mixture. When all epoxy was uniformly mixed, 15 g of photoiniator (UVI-6974) were added. Mixing continued at a temperature of 180 F for 10 min.

To the mixture, about 50 g of silica (Cab-O-Sil) were added. The mixture was stirred until the silica was wetted into the mix. An addition 50 g of silica (Cab-O-Sil) was combined with the mixture while continuing mixing until the silica was fully dispersed.

The mixture was transferred to a vacuum chamber and maintained under vacuum until all bubbling ceased in the mixture. About ½ gallon of the inventive composition was obtained.

Example 4

The composition described by Examples 2 and 3 was applied to a metal substrate and cured in accordance with the instant Example. An ASEA Model 2000 Robot having a movable arm was employed to control the position of a SEMCO Dispensing tube. Movement of the arm was controlled by a ASEA (ABB) computer and software. Approximately 12 oz. of the inventive composition was applied at 40 psig via a Pyles High Flow Robot Gun that was mounted on the robot arm. The composition was dispensed through a round nozzle, approx. 1 cm. in diameter and cured subsequently by a shuttered UV lamp (1600 watt lamp) that was also attached to robot arm. A schematic drawing of this system is shown by aforementioned FIGS. 1 and 2.

The inventive composition was also applied from the robot arm by using a Pyles 5 gal. unheated pump (instead of the SEMCO tube), to supply the composition. A Pyles "snuff back" gun Model #12000 series was also substituted for the previously identified high flow gun. The gun also included a modified flattened nozzle that applied a ribbon stream of composition upon the substrate.

Example 5

A UV curable composition comprising the following components was prepared:

| COMPONENT | TRADE NAME | SUPPLIER | Wt. % |
|---|---|---|---|
| Cycloaliphatic Epoxy | Uvacure 1534 | UCB Radcure | 87 |
| Polyester Polyol | Dynacoll 7250 | Huls America | 4 |
| Phenoxy Resin | PKHM 85 | Phenoxy Specialties | 4 |
| Silicon Dioxide | Cab-O-Sil | Cabot | 4 |
| Sulfonium Salt | Cyracure UVI 6974 | Union Carbide | 1 |

The composition was prepared in a Ross DB-2 mixer and in accordance with the following method:

| 1. Add: | 5405 grams of 1534<br>260 grams of Cabosil | Set temp. to 180 F. | Mix in the Ross Mixer for 10 minutes at lowest speed setting. |
|---|---|---|---|
| 2. Add: | 270 grams of PKHM 85<br>270 grams of 7250 | Temp. at 180 F. | Mix for 20 minutes at lowest speed setting. |
| 3. Add: | 56 grams of 6974 | Temp, at 180 F. | Mix under vacuum for 20 minutes at lowest speed setting. |

Example 6

A UV curable composition comprising the following components was prepared:

| COMPONENT | TRADE NAME | SUPPLIER | Wt. % |
|---|---|---|---|
| Cycloaliphatic Epoxy | Uvacure 1534 | UCB Radcure | 87 |
| Polyester Polyol | Dynacoll 7250 | Huls America | 4 |
| Polyester Polyol | Tone 0301 | Union Carbide | 4 |
| Silicon Dioxide | Cab-O-Sil | Cabot | 4 |
| Sulfonium Salt | Cyracure UVI 6974 | Union Carbide | 1 |

The composition was combined in a Ross mixer and in accordance with the following method:

| 1. Add: | 5405 grams of 1534<br>260 grams of Cabosil | Set temp. to 180 F. | Mix for 10 minutes at lowest speed setting. |
|---|---|---|---|
| 2. Add: | 270 grams of Tone 0301<br>270 grams of 7250 | Temp. at 180 | Mix for 20 minutes at lowest speed setting. |
| 3. Add: | 56 grams of 6974 | Temp. at 180 F. | Mix under vacuum for 20 minutes at lowest speed setting. |

The temperate used for mixing in Examples 5 and 6 can range from about 150 to at least about 190 F. Acceptable results can also be obtained from formulations of Examples 5 and 6 that contain about 75 to about 95 wt. % epoxy and up to about 10 wt. % polyol and resin.

Example 7

A UV curable composition comprising the following components was prepared:

| COMPONENT | TRADE NAME | SUPPLIER | Wt. % |
|---|---|---|---|
| Cycloaliphatic Epoxy | Uvacure 1500 | UCB Radcure | 45 |
| Polyester Polyol | Tone 0301 | Union Carbide | 29 |
| Polyester Polyol | Dynacoll 7250 | Huls America | 12 |
| Phenoxy Resin | PKHP 200 | Phenoxy Specialties | 5 |
| Polybutadiene | Poly BD 605 | Elf Atochem | 6 |
| Silicon Dioxide | Cab-O-Sil | Cabot | 2 |
| Sulfonium Salt | Cyracure UVI 6974 | Union Carbide | 1 |

The composition was combined in a Ross DB-2 mixer and in accordance with the following method:

| 1. Add: | 2683 grams of 1500<br>1747 grams of Tone 0301<br>312 grams of PKHP 200 | Set temp. to 250. | Mix for 60 minutes at lowest speed setting. |
|---|---|---|---|
| 2. Add: | 686 grams of 7250<br>375 grams of Poly BD 605<br>125 grams of Cabosil | Temp. at 200 F. | Mix for 20 minutes at lowest speed setting. |
| 3. Add: | 56 grams of 6974 | Temp. at 150 F. | Mix under vacuum for 20 minutes at lowest speed setting. |

Example 8

A UV curable material comprising the following components was prepared:

| COMPONENT | TRADE NAME | SUPPLIER | AMOUNT |
|---|---|---|---|
| Cyclaliphatic epoxy | Uvacure 1500 | UCB Radcure | 73 wt. % |
| Polyester polyol | Tone 0301 | Union Carbide | 25 |
| Sulfonium Salt | Cyracure UVI-6974 | Union Carbide | 1 |
| Fluorinated Surfactant | Fluorad FC-171 | 3M | 1 |

The composition was prepared by combining the Uvacure 1500 and Tone 0301 in a mixing vessel. The mixture initially exhibited turbidity. The mixture was stirred until turbidity disappears and visually appears clear. The UVI-6974 and the Fluorad FC-171 were added to the mixture. Mixing was continued until the components were completely dispersed which occurred in about two minutes. The mixture was subjected to a vacuum to eliminate entrained air. The mixture was tested in accordance with conventional procedures and possessed the following characteristics:

| Brookfield Viscosity | 300–400 cps @ 20° C. |
|---|---|
| Hardness: | Shore 'A' - 95–100 |
| | Shore 'D' - >70 |
| Shrinkage: | Zero |

One desirable characteristic of this composition is that it can be applied to a substrate via spraying, e.g., by using a commercially available air or airless spray gun.

Example 9

A UV curable gel comprising the following components was prepared:

Gel A

| COMPONENT | TRADE NAME | SUPPLIER | AMOUNT |
|---|---|---|---|
| Cycloaliphatic epoxy | Uvacure 1500 UCB | Radcure | 47 wt. % |
| Bis-F epoxy | Epalloy 8230 | CVC Specialty Resings | 10 |
| Polyester polyol | Tone 0301 | Union Carbide | 36 |
| Sulfonium salt | UVI 6974 | Union Carbide | 2 |
| Silicon dioxide | Cab-O-Sil TS-720 | Cabot | 5 |

Gel A was prepared by mixing the Uvacure, Epalloy, and Tone together in a mixing vessel until the solution was clear. The UVI 6974 was added, and mixed until the components were dispersed (about 2 minutes). The Cab-O-Sil was added to the mixture to function as the gelling agent, and mixed until substantially lump-free. A vacuum was applied to the mixture until substantially all the air was removed (27 mm Hg, 10 minutes).

Gel B

| COMPONENT | TRADE NAME | SUPPLIER | AMOUNT |
|---|---|---|---|
| Cycloaliphatic epoxy | Uvacure 1500 | Radcure | 54 wt % |
| Polyester polyol | Tone 0301 | Union Carbide | 38 |
| Sulfonium salt | UVI-6974 | Union Carbide | 2 |
| Silicon dioxide | Cab-O-Sil M5 | Cabot | 4 |
| Surfactant | Texaphor Special | Henkel | 2 |

Gel B was prepared by mixing the Uvacure and Tone together in a mixing vessel until the solution was clear. The UVI 6974 was added, and mixed until the components were substantially dispersed (about 2 minutes). The Cab-O-Sil was added to the mixture and mixed until substantially lump-free. A vacuum was applied to the mixture until substantially all of the air was removed (27 mm Hg, 10 minutes). Mixture was gel-like, but was not self-supporting. A gelling agent comprising a surfactant was added to the gel-like mixture. A gel, thereafter, formed rapidly.

Gel C

| COMPONENT | TRADE NAME | SUPPLIER | AMOUNT |
|---|---|---|---|
| Cycloaliphatic epoxy | UVACURE 1500 | Radcure | 87 wt. % |
| Sulfonium salt | UVI 6974 | Union Carbide | 1 |
| Silicon dioxide | Cab-O-Sil M5 | Cabot | 3 |
| Polyether Polyol | LG 650 | Arco | 9 |

Gel C was prepared by mixing the Uvacure and polyol together in a mixing vessel until solution is clear. The UVI 6974 was added, and mixed until substantially dispersed (about 2 minutes). The Cab-O-Sil was added to mixture and mixed until the mixture was substantially lump free. A vacuum was applied upon the mixture until substantially all of the air was removed (27 mm Hg, 10 minutes).

The following Table lists the Brookfield Viscosity Data for Gels A, B and C (cps, in thousands) measured at 20 C using a number 6 spindle as a function of revolutions per minute (RPM).

| RPM | Gel A | Gel B | Gel C |
|---|---|---|---|
| 0.5 | 436 | 376 | 160 |
| 1 | 242 | 198 | 98 |
| 2.5 | 118 | 80 | 45 |
| 5 | 68.8 | 44 | 36 |
| 10 | 41.6 | 25.2 | 21 |
| 20 | 25.7 | 14.6 | 13.7 |
| 50 | 14.3 | 7.9 | 9.2 |
| 100 | 9.58 | 4.88 | 5.9 |

Example 10

A UV curable foam having the following components was prepared:

| COMPONENT | TRADE NAME | SUPPLIER | AMOUNT |
|---|---|---|---|
| Cycloaliphatic epoxy | UVACURE 1500 | Radcure | 50 wt. % |
| Polyester polyol | Tone 0301 | Union Carbide | 40 |
| Mechanical blowing agent | Expancel DU551 | Nobel | 9 |
| Sulfonium salt | UVI-6974 | Union Carbide | 1 |

The above components were combined as follows. The Uvacure and polyol were added together in a mixing vessel and mixed until the solution was clear. The UVI 6974 was added to the mixture, and mixed until substantially completely dispersed (about 2 minutes). The Expancels spheres were added to the mixture and mixed until substantially lump free. For best results, the minimum amount of mixing time, and shear were employed

Example 11

A UV curable composition comprising the following components was prepared:

| COMPONENT | TRADE NAME | SUPPLIER | AMOUNT |
|---|---|---|---|
| Cycloaliphatic epoxy | Uvacure 1500 | UCB Radcure | 31 wt. % |
| Bis-F epoxy | Epalloy 8230 | CVC Specialty Resings | 11 |
| Polyester polyol | Tone 0301 | Union Carbide | 33 |
| Polyester polyol | Dynacoll 7110 | Huls America | 21 |
| Sulfonium salt | UVI 6974 | Union Carbide | 2 |
| Silicon dioxide | Cab-O-Sil TS-720 | Cabot | 2 |

This composition was prepared by heating the Uvacure, Epalloy, Dynacoll, and Tone together in a mixing vessel at a temperature of 180 F. The materials were mixed until the solution was clear. The UVI 6974 was added, and mixed until the components were dispersed (about 2 minutes). The Cab-O-Sil was added to the mixture and mixed until substantially lump-free. A vacuum was applied to the mixture until substantially all the air was removed (27 mm Hg, 10 minutes).

This composition was applied onto a bent 4×12 inch that had been coated with an automotive E-Coat, exposed to UV light, painted white, baked and then subjected to a South Florida Inland, 5° South, Direct Weathering Exposure to determine the microbial resistance of this composition. After periods of three months, six months, twelve months and twenty-four months, no mold, mildew or other microbe growth was detected by visual observation.

Example 12

This Example illustrates a two component system that can be produced without radiation curing. The composition was obtained by contacting Part "A" with Part "B". Part "A" and Part "B" were pre-blended in a mixer and contacted by static mixer. The resulting composition was pumpable, paintable and can be employed for repairing damaged painted surfaces, e.g, an automotive body panel. The following tables list the components of Part A and Part B.

| TRADENAME | COMPONENT | AMOUNT |
|---|---|---|
| Part A | | |
| Uvacure 1500 | cycloaliphatic epoxy | 35 |
| Dynacoll 71 1 0 | polyol | 10 |
| Cab-O-Sil M5 | silica powder | 5 |
| Part B | | |
| Tone 0301 | polyol | 35 |
| Dynacol 71 1 0 | polyol | 10 |
| Cab-O-Sil | silica powder | 3 |
| commodity | phosphoric acid | 2 |

Example 13

This Example illustrates using a robotic means for applying a UV curable material within an automotive roof ditch in order to seal the underlying weld. The UV curable composition of Example 5 was dispensed into an automotive roof ditch by a computer controlled robot by using a Pyles 5 gallon, reciprocating piston, positive displacement pump, SECO temperature controlled metering system and snuff back robot gun. Two robots were used for this application trial: a) Fanuc model F500 was employed to dispense the composition into the ditch and b) a Fanuc model 420i was employed to transport a UV light source along the ditch to cure the composition. The UV light source comprised a Fusion Systems model T-6, 500 watts/inch, 6 inch bulb, H type, mounted on the arm of the model 420i so that the UV bulb ran parallel to ditch. The composition was dispensed at a rate of 250 mm/sec and the UV light was passed over the dispensed composition at a rate of 250 mm/sec; for a total application and cure time of 30 seconds. The material was applied at ambient temperatures.

The following process steps were used to dispense and cure the composition:

1. Cure robot start position was directly behind a "D" pillar end of the roof ditch with UV light on.
2. The dispensing robot moved to an initial position (positioned 3 to 5 mm directly above the ditch) approximately 18 inches in front of the end of the ditch (between D and C pillar).
3. The UV curable composition was applied into the ditch moving toward the D pillar. Material was applied to within 8 to 15 mm of the end of the ditch. at which time the dispensing robot moves up and away from the ditch.
4. The cure robot immediately started moving along the length of the ditch starting at the D pillar and moving forward. Meanwhile, the dispensing robot moved back to its original starting point (3 to 5 mm directly above the ditch approximately 18 inches in front of the end of the ditch) and applied material in the ditch while moving forward.
5. At this point, both robots moved in tandem forward along the ditch. The distance between the dispensing gun and lamp housing was approximately 6 to 8 inches.
6. The dispensing robot applied material in the ditch to within 8 to 15 mm of the front of the ditch (A pillar) and immediately moved up and away from the ditch.
7. The cure robot continued movement to the front of the ditch (A pillar) and immediately reversed direction, traveling back the entire length of the ditch and stopping at its original start position
8. The UV light was turned off and a self-supporting layer was formed in the ditch.

Example 14

This Example illustrates adding a silane compound to the curable composition of Example 5 for improving paint adhesion, high temperature resistance. e.g., to temperatures of greater than 340 F, among other properties.

A curable composition having the following components was prepared:

| COMPONENT | Trade Name | Supplier | Wt. % |
|---|---|---|---|
| Cycloaliphatic Epoxy | Uvacure 1534 | UCB Radcure | 86 |
| Polyester Polyol | Dynacoll 7250 | Huls America | 4 |
| Phenoxy Resin | PKHM 85 | Phenoxy Specialties | 4 |
| Silicon Dioxide | Cab-O-Sil | Cabot | 4 |
| Sulfonium Salt | Cyracure UVI 6974 | Union Carbide | 1 |
| Silane | Z-6040 | Dow Corning | 1 |

The above composition was prepared in a Ross DB-2 mixer and in accordance with the following method:

| | | | |
|---|---|---|---|
| 1. Add: | 4600 grams of 1534<br>230 grams of Cabosil | Set temp. to 180 F. | Mix in the Ross Mixer for 10 minutes at lowest speed setting. |
| 2. Add: | 230 grams of PKHM 85<br>230 grams of 7250 | Temp. at 180 F. | Mix for 20 minutes at lowest speed setting. |
| 3. Add: | 51.5 grams of 6974<br>51.5 grams of Z-6040 | Temp, at 180 F. | Mix under vacuum for 20 minutes at lowest speed setting. |

The mixed composition was applied onto a 4'×12' ED5100 Electro-painted test panel and cured by exposure to UV light in accordance with Example 13. The cured composition was coated with a powder primer paint.

The powder paint comprised PCBV70100M supplied by PPG, Pittsburgh, Pa. The paint was applied in accordance with conventional practice by using an Eastwood Company applicator (HotCoat coating system part no. 1980) The powder paint coated test panel was baked within one hour of application at 340 F. for 20 minutes. The panel inspected visually and was uniformly coated with no visual defects.

Example 15

This Example illustrates a pigment containing curable composition. The composition of Example 14 was modified by adding a pigment, E2557 green (or other color supplied by Akrochem). The curable material was applied and processed as in Example 14.

Example 16

This Example illustrates a radiation curable composition that can be sprayed upon a substrate and subsequently cured. The following composition was prepared in accordance with the method of Example 14.

| COMPONENT | TRADE NAME | SUPPLIER | AMOUNT |
| --- | --- | --- | --- |
| Cyclaliphatic epoxy | Uvacure 1500 | UCB Radcure | 47 wt. % |
| Polyester polyol | Tone 0301 | Union Carbide | 36 |
| Sulfonium Salt | Cyracure UVI-6974 | Union Carbide | 1 |
| Fluorinated Surfactant | Fluorad FC-171 | 3M | 1 |
| Bis F epoxy | Epalloy 8230 | CVC Specialties | 15 |

The above composition was sprayed at a pressure of 80 psi by using a DeVilibis type MBC spray gun onto a painted substrate. The substrate comprised a commerically available automobile body panel that had been painted with tan DuPont Centari Acrylic Enamel. The sprayed coating was cured by exposure to naturally occurring UV radiation.

This composition can be employed in a wide range of end-uses including upon a previously painted surface, e.g. an automotive body panel, for improving abrasion resistance, among other properties of the painted surface.

In an alternative embodiment of this Example, a temporary or removable coating can be applied onto a substrate. The coating can be applied onto a painted surface and, thereafter, either be removed or replaced. This type of coating can be obtained by either applied a surface tension agent, e.g., a commercially available wax or surface protectant, or by adding a relatively high amount of a surfactant, e.g., bis-F epoxy, to the sprayable composition. The removable spray composition can be applied onto a painted or unpainted surface in order to impart temporary protection, e.g., from extreme environment conditions, road hazards, transportation, etc., and, thereafter, removed or reapplied as desired.

Example 17

This Example illustrates a method for using the UV curable composition formed in accordance with Example 14 to repair surface damage to a metallic surface. The repaired surface can be painted or re-painted.

PROCEDURE 1: Repair of dent, defect or hole in a metal panel

A substrate comprising a commercially available ED5100 laboratory test panel was cleaned with an alcohol/naptha containing wipe and coated in accordance with conventional methods with a DuPont 30S primer and DuPont Centari Acrylic Enamel (OEM recommendations or equivalent Body shop materials should be used).

The UV curable composition was applied by hand/brush and cured by being exposed to UV light so as to provide the curable composition protruding above intended repair area. The UV curable composition can be layered to achieve proper depth where required.

After being exposed to UV radiation, the cured composition was allowed to continuing curing under ambient conditions for a period of 3–4 Hrs. The cured composition was then sanded by hand with 180 through 360 grit sandpaper. The sanded surface was then coated with the aforementioned primer and paint.

Infared or convection heat sources can be used, if desired, for reducing the post cure time, e.g., about 150 to about 200 F.

PROCEDURE 2: Repair of existing sealer in seam.

The sealant applied in accordance with Example 14 was removed by sanding. The damaged area was cleared of dust or any other residue and cleaned with an alcohol/naptha wipe (any other suitable cleaner can be employed). The UV composition was applied by hand/brush and cured by being exposed to UV light so as to provide the sealer protruding above the surrounding area.

After being exposed to UV radiation, the cured composition was allowed to continuing curing under ambient conditions for a period of 3–4 Hrs. The cured composition was then sanded by hand with 180 through 360 grit sandpaper. The sanded surface was then coated in turn DuPont 30S primer and DuPont Centari Acrylic Enamel.

Infared or convection heat sources can be used, if desired, for reducing the post cure time, e.g., about 150 to about 200 F.

These Examples demonstrate that the inventive composition and method can be employed for repairing a damaged automotive body panel.

Example 18

This Example demonstrates a UV curable material that is subsequently baked at a temperature of about 200 to 300 F.

| COMPONENT | TRADE NAME | SUPPLIER | AMOUNT |
| --- | --- | --- | --- |
| cycloaliphatic epoxy | Uvacure 1500 | UCB Radcure | 47.9 wt % |
| polyether polyol | PPG-725 | Lyondell | 45.6 |
| sulfonium salt photoinitiator | UVI-6974 | Union Carbide | 0.5 |
| treated fumed silica | Aerosil R202 | Degussa | 1 |
| treated fumed silica | Aerosil R805 | Degussa | 5 |

The liquid components of the composition were combined within the mixing apparatus described in Example 14. The silicas were added to the liquid mixture and mixed until dispersion was completed. The mixed composition was then applied to commercial automotive Ecoated panels (Coremax EP) and cured with an HP-6 High-powered UV Lamp System (Fusion UV Systems, Inc.) using a "D" bulb. The "D" bulb has a UV output of varying intensities in a wavelength range from about 200 nm to about 600 nm. The composition was fully cured after exposure to a depth of approximately 0.5 inch (the depth of cure can vary depending on the UV source and the distance of the source from the material). The UV cured composition on the ECoat panel was baked in a 200–300° F. oven to further cure the composition (alternatively, the UV cured composition can be allowed to cure further under ambient conditions). The cured composition adhered to the e-coated metal as evidenced by continued adhesion of the ecoat material to the UV material when the metal panel is bent in half.

Example 19

This is a variation of the composition in Example 18 which retains the same epoxy to hydroxy ratio, henceforth known as the EHR. The EHR is the ratio of the number of epoxy groups in the formulation to the number of hydroxy groups present. Typical EHRs for the inventive composition can range from 20 to 2, depending on the raw materials used.

| COMPONENT | TRADE NAME | SUPPLIER | AMOUNT |
|---|---|---|---|
| Cycloaliphatic epoxy | Uvacure 1500 | UCB Radcure | 44 wt % |
| Polyether Polyol | PPG-3025 | Lyondell | 11 |
| Polyether Polyol | PPG-725 | Lyondell | 39 |
| Sulfonium Salt Photoinitiator | UVI-6974 | Union Carbide | 0.5 |
| treated fumed silica | Aerosil R202 | Degussa | 0.5 |
| treated fumed silica | Aerosil R805 | Degussa | 5 |

Mixing, dispensing and curing of this formula was performed in accordance with Example 18.

The paintability of the cured compositions formed in Examples 18 and 19 was tested by applying commercial automotive primer (DuPont White), then baking at the recommended time and temperature. This was followed by a coat of commercial basecoat (DuPont Toreador Red), which was also baked according to the recommended parameters. Testing for adhesion was performed according to a modified version of GM9071P, the General Motors specification for "Tape Adhesion Test for Paint Finished." The cured compositions of Examples 18 and Example 19 remained paintable, as determined by GM9071P, even after storage for 48 hours at 100% condensing humidity.

The Shore A Durometer Hardness of aged and cured compositions formed in Examples 18 and 19 was measured in accordance with conventional methods. The cured compositions were aged for 48 hours in room temperature (RT), and 48 hours in 100% relative humidity (RH). The results of the Shore A measurements are listed below.

| | Shore A Durometer Values | |
|---|---|---|
| Formula | Storage | Shore A |
| Example 18 | RT, 48 hrs. | 88 |
| Example 19 | RT, 48 hrs. | 89 |
| Example 18 | 100% RH, 48 hrs. | 85 |
| Example 19 | 100% RH, 48 hrs. | 85 |

Example 20

This Example illustrates a UV curable composition having a decreased EHR.

| COMPONENT | TRADE NAME | SUPPLIER | AMOUNT |
|---|---|---|---|
| cycloaliphatic epoxy | Uvacure 1500 | UCB Radcure | 43.7 wt % |
| polyether polyol | PPG-725 | Lyondell | 49.7 |
| sulfonium salt photoinitiator | UVI-6974 | Lyondell | 0.6 |
| treated fumed silica | Aerosil R202 | Degussa | 1 |
| treated fumed silica | Aerosil R805 | Degussa | 5 |

This composition was mixed, dispensed and cured in accordance with the method of Example 18.

Example 21

This Example illustrates a UV curable composition having a decreased EHR.

| COMPONENT | TRADE NAME | SUPPLIER | AMOUNT |
|---|---|---|---|
| cycloaliphatic epoxy | Uvacure 1500 | UCB Radcure | 38.6 wt % |
| polyether polyol | PPG-725 | Lyondell | 54.9 |
| sulfonium salt photoinitiator | UVI-6974 | Union Carbide | 0.5 |
| treated fumed silica | Aerosil R202 | Degussa | 1 |
| treated fumed silica | Aerosil R805 | Degussa | 5 |

This composition was mixed, dispensed and cured in accordance with the method of Example 18.

Example 22

This Example demonstrates a UV curable composition having an increased tensile strength. This Example also illustrates a composition having an increased EHR.

| COMPONENT | TRADE NAME | SUPPLIER | AMOUNT |
|---|---|---|---|
| cycloaliphatic epoxy | Uvacure 1500 | UCB Radcure | 62.4 wt % |
| polyether polyol | PPG-725 | Lyondell | 31.1 |
| sulfonium salt photoinitiator | UVI 6974 | Union Carbide | 0.5 |
| treated fumed silica | Aerosil R202 | Degussa | 1 |
| treated fumed silica | Aerosil R805 | Degussa | 5 |

This composition was mixed, dispensed and cured in accordance with the method of Example 18. Tensile strengths for cured compositions formed in accordance with Examples 18–22 were tested and determined according to ASTM D638-96.

| Composition | Avg. Tensile Strength (lb/in$^2$) |
|---|---|
| Example 18 | 805 |
| Example 19 | 682 |
| Example 20 | 376 |
| Example 21 | 223 |
| Example 22 | 3,256 |

The following two examples (Examples 23 and 24) illustrate the addition of a non-functional resin as a component of the UV curable composition. When added in an effective amount, this resin functions as a toughener and/or flexibilizing agent.

Example 23

| COMPONENT | TRADE NAME | SUPPLIER | AMOUNT |
|---|---|---|---|
| cycloaliphatic epoxy | Uvacure 1500 | UCB Radcure | 42.5 wt % |
| polyether polyol | PPG-725 | Lyondell | 41 |
| ethylene-vinyl acetate copolymer resin | Elvax 46 | DuPont | 10 |
| sulfonium salt photoinitiator | UVI-6974 | Union Carbide | 0.5 |

-continued

| COMPONENT | TRADE NAME | SUPPLIER | AMOUNT |
|---|---|---|---|
| treated fumed silica | R202 | Degussa | 1 |
| treated fumed silica | R805 | Degussa | 5 |

The EVA copolymer resin was heated in a tin to a temperature of about 201° F. with an amount of the polyol sufficient to soften the EVA. While continuing to heat, the EVA copolymer was stirred into the polyol. Heating continued as the rest of the polyol was stirred in gradually. When the polyol/EVA mixture had cooled to a temperature of about 80° F. , the cycloaliphatic epoxy was added with stirring. When the addition of the epoxy was completed, the silicas were stirred into the mixture until completely dispersed. The mixed composition was then dispensed and cured in accordance with the method of Example 18.

Example 24

This composition was mixed, dispensed and cured in accordance with the method of Example 23.

| COMPONENT | TRADE NAME | SUPPLIER | AMOUNT |
|---|---|---|---|
| cycloaliphatic epoxy | Uvacure 1500 | UCB Radcure | 44.5 wt % |
| polyether polyol | PPG-725 | Lyondell | 44 |
| ethylene-vinyl acetate | Elvax 46 | DuPont | 5 |
| sulfonium salt photoinitiator | UVI-6974 | Union Carbide | 0.5 |
| treated fumed silica | R202 | Degussa | 1 |
| treated fumed silica | R805 | Degussa | 5 |

The tensile strength and percent elongation of the cured compositions formed in accordance with Examples 18–24 were determined. Tensile strengths. calculated according to ASTM D638-96, and percent elongation values are listed below. The percent elongation was calculated by dividing the displacement at maximum tensile load by the original gauge length. This value was then multiplied by 100.

| Composition | Avg. Tensile (lb/in$^2$) | % elongation |
|---|---|---|
| Example 18 | 805 | 49 |
| Example 19 | 682 | 45 |
| Example 22 | 1113 | 56 |
| Example 23 | 745 | 49 |

The following examples illustrate two-part systems that utilize a cationic type cure chemistry.

Example 25

| COMPONENT | TRADE NAME | SUPPLIER | AMOUNT |
|---|---|---|---|
| Part A | | | |
| Cycloaliphatic epoxy | Uvacure 1500 | UCB Radcure | 28.3 wt % |
| polyether polyol | PPG-3025 | Lyondell | 51.8 |
| polyether polyol | PPG-725 | Lyondell | 13.7 |
| sulfonium salt photoinitiator | UVI-6974 | Union Carbide | 1.1 |
| treated fumed silica | R805 | Degussa | 5.1 |

-continued

| COMPONENT | TRADE NAME | SUPPLIER | AMOUNT |
|---|---|---|---|
| Part B | | | |
| Cycloaliphatic epoxy | Uvacure 1500 | UCB Radcure | 26 wt % |
| polyether polyol | PPG-3025 | Lyondell | 47 |
| polyether polyol | PPG-725 | Lyondell | 12.8 |
| treated fumed silica | R805 | Degussa | 4.7 |
| Ground Polyethylene | | | 9.5 |

The liquids of Part A are mixed, and the silica added and dispersed in accordance with the method described in Example 18. The liquids of Part B are similarly mixed and the silica added. A UV-opaque filler, ground polyethylene, was then mixed into Part B.

Part A was activated by exposing it to UV radiation from a suitable source. Part A and Part B were then mixed together in a tin by hand, and allowed to cure.

Worktime (WT) of the activated compositions was measured in minutes and seconds at defined intervals by ascertaining when the activated composition began to harden or increase in viscosity. WT is given in minutes (') and seconds ("). The worktime of the activated composition can be adjusted by the dosage or wavelength of UV radiation it receives. Below is a table listing the worktimes obtained with Parts A and B above when they were irradiated at three (3) UV exposures which gave the dosages (Joules/cm$^2$) listed below.

| | Approximate Dosages (Joules/cm$^2$) | | | |
|---|---|---|---|---|
| WT | UVA | UVB | UVC | UVV |
| 17' | 0.230 | 0.152 | 0.015 | 0.108 |
| 1'56" | 0.334 | 0.242 | 0.026 | 0.175 |
| 1'40" | 0.465 | 0.310 | 0.032 | 0.259 |

The above table illustrates that the worktime (WT) decreases as the UV dosage is increased.

Example 26

This Example illustrates a two component UV curable composition having a pre-iniated component.

| COMPONENT | TRADE NAME | SUPPLIER | AMOUNT |
|---|---|---|---|
| Part A | | | |
| Polyether polyol | PPG-725 | Lyondell | 92.8 wt % |
| Sulfonium salt photoinitiator | UVI-6974 | Union Carbide | 1.1 |
| treated fumed silica | R202 | Degussa | 1.1 |
| treated fumed silica | R805 | Degussa | 5 |
| Part B | | | |
| Cycloaliphatic epoxy | Uvacure 1500 | UCB Radcure | 94 wt % |
| Treated fumed silica | R202 | Degussa | 1 |
| Treated fumed silica | R805 | Degussa | 5 |

The cycloaliphatic epoxy was confined or isolated to one side of the system, (Part A), while the photoinitiator and polyol (non-reactive without the epoxy) were present only in Part B. Without wishing to be bound by any theory or explanation, it is believed that the UV-exposed photoinitiator should remain active for a relatively long period of time since it does not react with the polyol. Part A was prepared in accordance with accordance with the method described in Example 18, and irradiated with the UV source also described in Example 18, then mixed with Part B by hand. A reaction between the Part A and Part B occurred in 0.25–0.5 minutes.

A portion of Part A was irradiated with the UV radiation, but this time 5 minutes were allowed to pass before mixing with Part B. A reaction took place within 0.5 minutes.

Another portion of Part A was exposed to the UV radiation, but allowed to remain undisturbed for 1 hour before mixing with Part B. Reaction took place within 42 seconds.

Example 27

This Example illustrates a two component system having at least one pre-initiated component and dispensing the components through a static tube mixer.

| COMPONENT | TRADE NAME | SUPPLIER | AMOUNT |
|---|---|---|---|
| Part A | | | |
| Polyether polyol | PPG-725 | Lyondell | 92.8 wt % |
| Sulfonium salt photoinitiator | UVI-6974 | Union Carbide | 1 |
| treated fumed silica | R202 | Degussa | 1.1 |
| treated fumed silica | R805 | Degussa | 5.1 |
| Part B | | | |
| Cycloaliphatic epoxy | Uvacure 1500 | UCB Radcure | 46.2 wt % |
| Ground silica | Goresil 1045 | C.E.D. Processed Minerals, Inc. | 53.8 |

Part A was prepared in accordance with the methods described in Example 18 and exposed to light from the UV source described in Example 18 (UVA dosage=approx. 3.8 J/cm$^2$) and loaded into one side of a static mixer cartridge (commercially available from Mixpac). Part B was prepared in accordance with Example 18, and loaded into the other side of the static mixer cartridge. When extruded through a static mixing tip, the material cured within 1 minute. The material in the cartridge was extruded through a static mixer 4 hours later and cured within 1 minutes. Two days later, these pre-initiated materials were mixed and cured within 2 minutes.

Example 28

This Example illustrates a pre-iniated composition, and worktime of the composition as a function of time after being pre-iniated.

| COMPONENT | TRADE NAME | SUPPLIER | AMOUNT |
|---|---|---|---|
| Part A | | | |
| Polyether polyol | PPG-725 | Lyondell | 94.8 wt % |
| Sulfonium salt photoinitiator | UVI-6974 | Union Carbide | 1.1 |
| treated fumed silica | R202 | Degussa | 4.1 |
| Part B | | | |
| Cycloaliphatic epoxy | Uvacure 1500 | UCB Radcure | 96.0 wt % |
| treated fumed silica | R202 | Degussa | 4.0 |

Part A and Part B were prepared in accordance with the methods described in Example 18. Part A was irradiated with the UV source described in Example 18 to give a UVA dosage≅3.8 J/cm$^2$. Part A and Part B were weighed and mixed by hand. The worktime in minutes and seconds was determined visually as the first sign of color and thickening of the mixture. The weighing and worktime evaluation was conducted over a period of several days to determine how long the irradiated photoinitiator remained active.

| Days after UV exposure | Part A weight (g) | Part B weight (g) | Worktime |
|---|---|---|---|
| 0 | 1.01 | 1.05 | 45" |
| 1 | 1.01 | 1.06 | 40" |
| 2 | 1.05 | 1.04 | 41" |
| 3 | 1.06 | 1.05 | 46" |
| 4 | 1.02 | 1.03 | 48" |
| 7 | 1.01 | 1.01 | 56" |
| 8 | 1.05 | 1.05 | 59" |
| 9 | 1.05 | 1.04 | 1'05" |
| 10 | 1.03 | 1.04 | 55" |
| 14 | 1.03 | 1.02 | 1'19" |
| 15 | 1.02 | 1.04 | 1'23 |

A skilled person in this art would understand that these Exemplary processes can be modified by manipulating process variables such as time and temperature of each aforementioned mixing step, mixing rate (RPM), time under vacuum, amount and type of energy source, and level of vacuum (mm Hg) as well as operating a continuous process. While the above Examples illustrate a batch process a skilled person in this art after having reviewed and understood the instant disclosure, would be capable of manipulating the aforementioned process variables to tailor the instant composition for a virtually unlimited array of product applications.

While the present invention has been described in certain preferred embodiments thereof, it will be apparent that various substitution, omissions, modifications, and other changes which may be made without departing from the spirit of the invention. Thus, the present invention should be limited only by the scope of the following claims including equivalents thereof.

What is claimed is:

1. A method for providing a coating on an automotive body component from a composition comprising a combination comprising at least one epoxy compound, at least one polyol and at least one ultra-violet photoinitiator wherein said method comprises:
   (a) applying the exposed composition onto the automotive body component wherein at least a portion of the automotive body component has a vertical surface, and,
   (b) exposing the automotive body component to a source comprising ultra-violet radiation thereby forming a coating upon the automotive body component.

2. The method according to claim 1 wherein the automotive body component comprises at least one member selected from the group of floor pan, roof and lower body panel.

3. The method according to claim 1 wherein the automotive body component comprises a lower body panel wherein the coating forms an anti-chip coating.

4. The method according to claim 1 wherein the automotive body component is formed by welding together at least two automotive body components.

5. The method according to claim 1 further comprising (c) heating the coated substrate to a temperature sufficient to improve adhesion of the composition to the substrate.

6. The method according to claim 1 wherein the epoxy compoiund comprises a cycloaliphatic epoxy compound.

7. The method according to claim 1 wherein the polyol comprises a polyether polyol a polyester polyol or mixture thereof.

8. The method according to claim 1 wherein the UV photoinitiator comprises at least one onium salt.

9. The method according to claim 8 wherein the radiation comprises ultraviolet radiation having a wavelength of about 250 to about 400 nm.

10. The method according to claim 1 wherein the ultraviolet photoinitiator comprises a sulfonium onium salt.

11. The method of claim 1 wherein the composition further comprises a thickening agent.

12. The method according to claim 11 wherein the thickening agent comprises silica.

13. The method according to claim 11 wherein the thickening agent is present in amount effective to provide a thixotropic composition.

14. The method according to claim 11 further comprising (e) at least one monomeric material.

15. A method of coating a brake rotor comprising:
   (a) providing a composition comprising a combination comprising at least one epoxy, at least one polyol and at least one ultraviolet photo-initiator,
   (b) applying the composition onto at least a portion of the brake rotor,
   (c) exposing the brake rotor to a source of ultraviolet radiation, and;
   (d) recovering a coated brake rotor.

16. The method according to claim 15 further comprising heating the brake rotor.

17. The method according to claim 1 wherein said composition further comprises at least one pigment.

18. A method for providing a coating on an automotive body component from a composition comprising a combination comprising at least one epoxy compound, at least one polyol and at least one ultra-violet photoinitiator wherein said method comprises:
   (a) applying the composition onto the automotive body component wherein the automotive body component comprises a weld formed between at least two adjacent components, and,
   (b) exposing the automotive body component to a source comprising ultra-violet radiation thereby forming a coating upon the automotive body component.

19. The method of claim 18 wherein a plurality of protrusions extend from the weld and said composition embeds said protrusions.

20. The method of claim 18 wherein the weld is located within a channel having a trapezoidal cross-section.

* * * * *